(12) United States Patent
Sakashita

(10) Patent No.: US 8,021,962 B2
(45) Date of Patent: Sep. 20, 2011

(54) FUNCTIONAL FILM CONTAINING STRUCTURE AND METHOD OF MANUFACTURING FUNCTIONAL FILM

(75) Inventor: Yukio Sakashita, Kaisei-machi (JP)

(73) Assignee: Fujifilm Corporation, Tokyo (JP)

(*) Notice: Subject to any disclaimer, the term of this patent is extended or adjusted under 35 U.S.C. 154(b) by 393 days.

(21) Appl. No.: 11/916,642

(22) PCT Filed: Jun. 5, 2006

(86) PCT No.: PCT/JP2006/311668
§ 371 (c)(1),
(2), (4) Date: Dec. 5, 2007

(87) PCT Pub. No.: WO2006/132381
PCT Pub. Date: Dec. 14, 2006

(65) Prior Publication Data
US 2009/0111279 A1 Apr. 30, 2009

(30) Foreign Application Priority Data
Jun. 7, 2005 (JP) .................. 2005-166404

(51) Int. Cl.
*H01L 21/30* (2006.01)
(52) U.S. Cl. ........ 438/458; 438/406; 438/768; 438/795; 257/E21.317; 257/E21.328; 257/E21.57
(58) Field of Classification Search ............... 438/402, 438/409, 768; 257/E21.317, E21.471, E21.497, 257/E21.498
See application file for complete search history.

(56) References Cited

U.S. PATENT DOCUMENTS

| 3,053,651 A | 9/1962 | McGauley |
| 4,259,401 A | 3/1981 | Chahroudi et al. |
| 6,071,795 A | 6/2000 | Cheung et al. |
| 2002/0047203 A1 | 4/2002 | Akahori et al. |
| 2004/0125197 A1* | 7/2004 | Ogihara et al. ............ 347/238 |

FOREIGN PATENT DOCUMENTS

| JP | 54-94905 A | 7/1979 |
| JP | 10-125929 A | 5/1998 |
| JP | 2004-165679 A | 6/2004 |

OTHER PUBLICATIONS

Annemarie De La Croix, et al., "Modeling the Thermal Decomposition of Solids on the Basis of Lattice Energy Changes", Journal of Solid State Chemistry, 1998, pp. 332-345, vol. 137, Article No. SC977746, XP-002402214.

Zongrong Liu, et al., "Calorimetric evaluation of phase change materials for use as thermal interface materials", Thermochimica Acta, 2001, pp. 135-147, vol. 366, XP-002402215.

* cited by examiner

*Primary Examiner* — Cheung Lee
(74) *Attorney, Agent, or Firm* — Sughrue Mion, PLLC (57) ABSTRACT

A method of manufacturing a functional film by which a functional film formed on a film formation substrate can be easily peeled from the film formation substrate. The method includes the steps of: (a) forming a separation layer on a substrate by using an inorganic material which is decomposed to generate a gas by being applied with an electromagnetic wave; (b) forming a layer to be peeled containing a functional film, which is formed by using a functional material, on the separation layer; and (c) applying the electromagnetic wave toward the separation layer so as to peel the layer to be peeled from the substrate or reduce bonding strength between the layer to be peeled and the substrate.

16 Claims, 4 Drawing Sheets

ELECTROMAGNETIC WAVE

ELECTROMAGNETIC WAVE

FIG.6D

FUNCTIONAL FILM CONTAINING STRUCTURE AND METHOD OF MANUFACTURING FUNCTIONAL FILM

TECHNICAL FIELD

The present invention relates to a method of manufacturing a functional film including a dielectric material, piezoelectric material, pyroelectric material, magnetic material, semiconductor material or the like, and a functional film containing structure to be used in a manufacturing process of the functional film.

BACKGROUND ART

Recent years, in response to the needs for electronic devices such as miniaturization, speeding up, integration, and multifunctionality, the manufacture of devices containing functional materials such as electronic ceramics, which express predetermined functions by being applied with electric fields or magnetic fields and include a dielectric material, piezoelectric material, magnetic material, pyroelectric material and semiconductor material, by using various film formation technologies has been actively studied.

For example, in order to enable high-definition and high-quality printing in an inkjet printer, it is necessary to miniaturize and highly integrate ink nozzles of inkjet heads. Accordingly, it is also necessary to similarly miniaturize and highly integrate piezoelectric actuators for driving the respective ink nozzles. In such a case, a film formation technology, that enables formation of a thinner layer than a bulk material and formation of fine patterns, is desired, and film formation technologies such as a sputtering method, a sol-gel method, and an aerosol deposition method have been studied.

However, there has been a problem that a film of function material (also simply referred to as "functional film") formed by film formation does not sufficiently exert its function in a condition after the film formation, and the film is inferior to a bulk material in performance.

In order to sufficiently express the function of a functional film, heat treatment at relatively high temperature (e.g., about 500° C. to 1000° C.) is required after film formation. Since a substrate that is used at the time of film formation (film formation substrate) is simultaneously heat-treated, high heat tolerance is required for the material of film formation substrate. On the other hand, in the case where a fabricated function film is utilized, there is demand for using various kinds of substrates according to instruments such as a flexibly substrate made of resin, for example. Accordingly, a method has been studied by which a functional film formed on a film formation substrate can be peeled or transferred from the film formation substrate without hindering its function.

As a related technology, Japanese Patent Application Publication JP-A-54-94905 discloses a multilayered structure for thin film transfer having a heat-resistant substrate, a release layer principally containing carbon and/or carbon compound, and a functional thin film as main component elements (page 1). Further, JP-A-54-94905 discloses that the functional thin film can be peeled from the heat-resistant substrate and transferred to another substrate because the release layer can be removed by oxidization (combustion) (page 3).

Japanese Patent Application Publication JP-A-10-125929 discloses a peeling method by which any material to be peeled can be easily peeled regardless of its properties and conditions, and especially, the peeled material can be transferred to various transfer materials. The peeling method is to peel a material to be peeled existing on a substrate via a separation layer having a multilayered structure of plural layers from the substrate, and includes the steps of applying irradiating light to the separation layer to cause peeling within the layer of the separation layer and/or at an interface thereof so as to detach the material to be peeled from the substrate (pages 1 and 2). Further, in JP-A-10-125929, as the composition of a light absorption layer, amorphous silicon, silicon oxide, dielectric material, nitride ceramics, organic polymer and so on are cited (pages 5 and 6).

Japanese Patent Application Publication JP-P2004-165679A discloses a method of transferring a layer to be transferred containing a thin film device to a secondary transfer material, which method is for matching (i) a multilayer relationship of the layer to be transferred against a substrate used when the layer to be transferred is manufactured and (ii) a multilayer relationship of the layer to be transferred against a transfer material as a transfer destination of the layer to be transferred. The method includes the first step of forming a first separation layer on a substrate, the second step of forming a layer to be transferred containing a thin film device on the first separation layer, the third step of forming a second separation layer consisting of a water-soluble or organic solvent-soluble adhesive agent on the layer to be transferred, the fourth step of bonding a primary transfer material onto the second separation layer, the fifth step of removing the substrate from a material to be transferred by using the first separation layer as a boundary, the sixth step of bonding a secondary transfer material to an undersurface of the layer to be transferred, and the seventh step of bringing the second separation layer into contact with water or organic solvent to remove the primary transfer material from the transfer layer by using the second separation layer as a boundary (pages 1 and 2). Further, in JP-P2004-165679A, as the composition of the separation layer, amorphous silicon, silicon oxide, dielectric material, nitride ceramics, organic polymer and so on are cited (pages 8 and 9).

However, according to JP-A-54-94905, since the release layer is removed by oxidation reaction, the atmosphere in the heat treatment process is limited to an oxygen atmosphere. Further, since carbon or carbon compound is used as the release layer, there is the upper limit to heating temperature. For example, in an embodiment disclosed in JP-A-54-94905 (pages 1 and 3), the treatment temperature in the transfer process is 630° C. at the highest. Therefore, the invention disclosed in JP-A-54-94905 cannot be applied to a manufacture of electronic ceramics that requires heat treatment at relatively high temperature (e.g., 700° C. or more).

According to JP-A-10-125929, peeling is caused within the separation layer or at the interface by applying a laser beam to a light absorption layer contained in the separation layer to allow the light absorption layer to ablate. That is, a solid material contained in the light absorption layer is photochemically or thermally excited by absorbing applied light, and thereby, bonding between atoms or molecules of the surface or inside thereof is cut and they are released. As a result, a phase change such as melting or transpiration (vaporization) occurs in the constituent material of the light absorption layer, and the material to be peeled is peeled at relatively low temperature. However, according to the method, the peeling property is likely to be insufficient. Further, JP-A-10-125929 does not disclose that a chemical change such as reaction with other component or decomposition is made in a constituent material of the light absorption layer.

On the other hand, according to JP-P2004-165679A, when the thin film device is detached from the substrate by applying a laser beam to the separation layer, in order to peel the thin film device from the substrate more reliably, ions for promoting peeling are implanted into the separation layer. According to such a method, inner pressure is generated in the separation layer and the peeling phenomenon is promoted. However, since hydrogen ions cited as ions for promoting peeling in JP-P2004-165679A are gasified at 350° C. or more and exit from the separation layer (page 6), the process temperature after ion implantation can not be set to 350° C. or more.

DISCLOSURE OF THE INVENTION

In view of the above-mentioned problems, a first purpose of the present invention is to provide a method of manufacturing a functional film by which a functional film formed on a film formation substrate can be easily peeled from the film formation substrate. Further, a second purpose of the present invention is to provide a functional film containing structure to be used in a manufacturing process of such a functional film.

In order to accomplish the purposes, a functional film containing structure according to a first aspect of the present invention includes: a substrate; a separation layer provided on the substrate and formed by using an inorganic material which is decomposed to generate a gas by being applied with an electromagnetic wave; and a layer to be peeled provided on the separation layer and containing a functional film formed by using a functional material, and the layer to be peeled is peeled from the substrate or bonding strength between the layer to be peeled and the substrate becomes lower by applying the electromagnetic wave toward the separation layer.

Further, a functional film containing structure according to a second aspect of the present invention includes: a substrate; a separation layer provided on the substrate and formed by using an inorganic material which reacts with a component in an atmosphere or a component contained in an adjacent layer to generate a gas by being applied with an electromagnetic wave; and a layer to be peeled provided on the separation layer and containing a functional film formed by using a functional material, and the layer to be peeled is peeled from the substrate or bonding strength between the layer to be peeled and the substrate becomes lower by applying the electromagnetic wave toward the separation layer.

A method of manufacturing a functional film according to a first aspect of the present invention includes the steps of: (a) forming a separation layer on a substrate by using an inorganic material which is decomposed to generate a gas by being applied with an electromagnetic wave; (b) forming a layer to be peeled containing a functional film, which is formed by using a functional material, on the separation layer; and (c) applying the electromagnetic wave toward the separation layer so as to peel the layer to be peeled from the substrate or reduce bonding strength between the layer to be peeled and the substrate.

Further, a method of manufacturing a functional film according to a second aspect of the present invention includes the steps of: (a) forming a separation layer on a substrate by using an inorganic material which reacts with a component in an atmosphere and/or a component contained in an adjacent layer to generate a gas by being applied with an electromagnetic wave; (b) forming a layer to be peeled containing a functional film, which is formed by using a functional material, on the separation layer; and (c) applying the electromagnetic wave toward the separation layer so as to peel the layer to be peeled from the substrate or reduce bonding strength between the layer to be peeled and the substrate.

Here, "reaction" refers to a process in which, from one material or material system, another material or material system different from the initial material or material system in composition or structure is produced. And "reaction" includes a process in which one kind of compound changes into two or more kinds of simpler materials, and a process in which, based on two kinds of materials including at least one kind of compound, two or more kinds of materials different from the initial materials are produced. Further, the former case is specifically referred to as "decomposition".

According to the present invention, the separation layer containing the inorganic material removable by applying an electromagnetic wave is provided between the substrate and the layer to be peeled containing the functional film, and therefore, the substrate and the functional film can be easily peeled. Alternatively, by reducing the bonding strength between the substrate and the functional film, they can be dynamically and easily peeled at the subsequent step. Accordingly, the functional film formed on the substrate by using a film formation technology can be easily transferred to a flexible substrate or the like having relatively low heat tolerance and utilized. Therefore, elements having advantageous properties can be suitably mounted on instruments according to application and the performance of the entire instruments utilizing such elements can be improved.

BRIEF DESCRIPTION OF THE DRAWINGS

Advantages and features of the present invention will be apparent by considering the following detailed description and the drawings in relation. In these drawings, the same reference numerals indicate the same component elements.

BEST MODE FOR CARRYING OUT THE INVENTION

Figure 1:
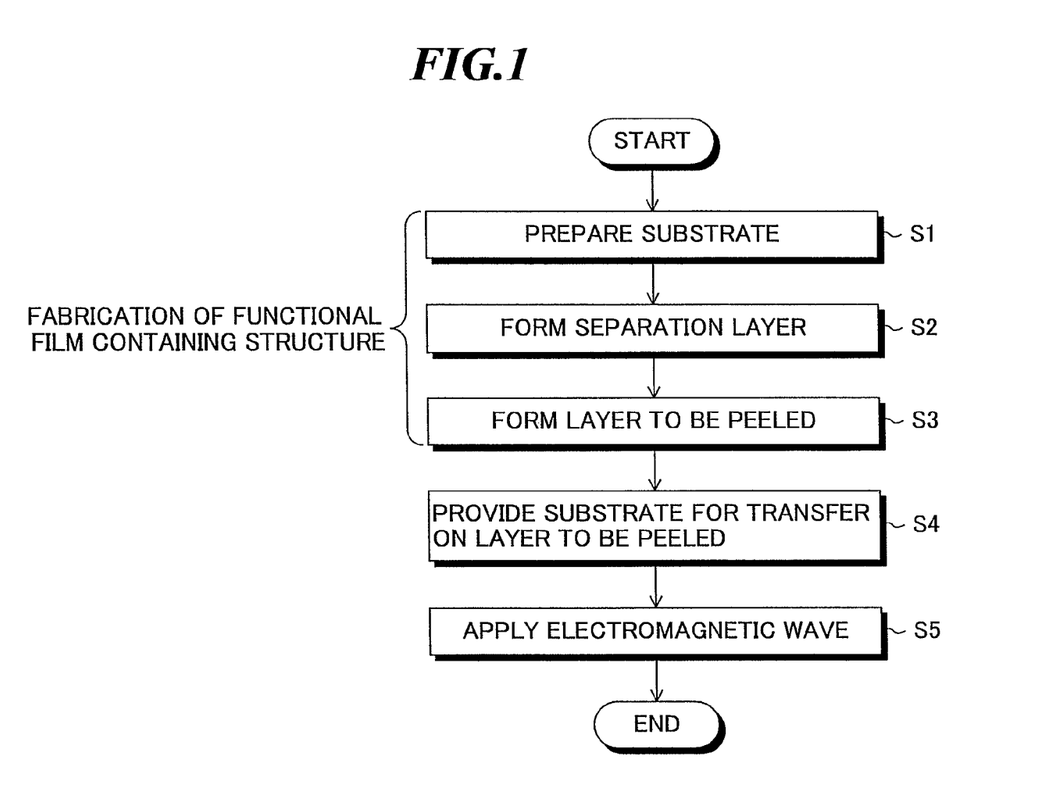
FIG. 1 is a flowchart showing a method of manufacturing a functional film according to the first embodiment of the present invention.

FIG. 1 is a flowchart showing a method of manufacturing a functional film according to the first embodiment of the present invention. Further, FIGS. 2A to 3 are diagrams for explanation of the method of manufacturing a functional film according to the first embodiment of the present invention, in which FIGS. 2A to 2C show steps of fabricating a functional film containing structure according to the first embodiment of the present invention.

Figure 2A:
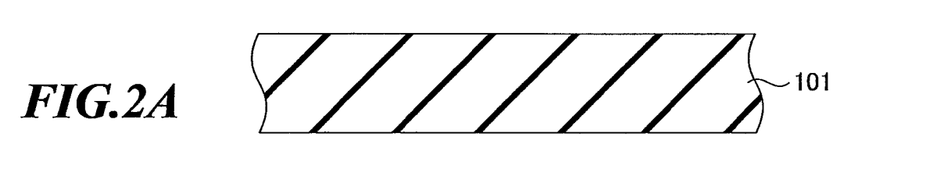
FIGS. 2A to 2E are sectional views for explanation of the method of manufacturing a functional film according to the first embodiment of the present invention.
Figure 2B:
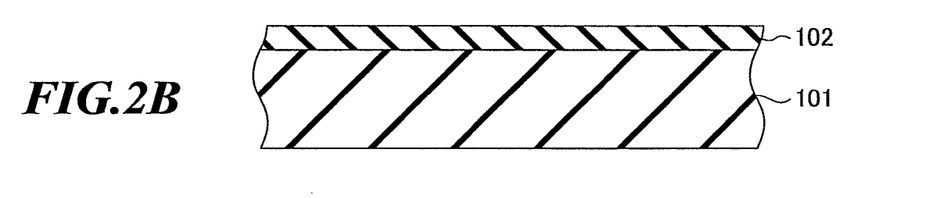
Figure 2C:
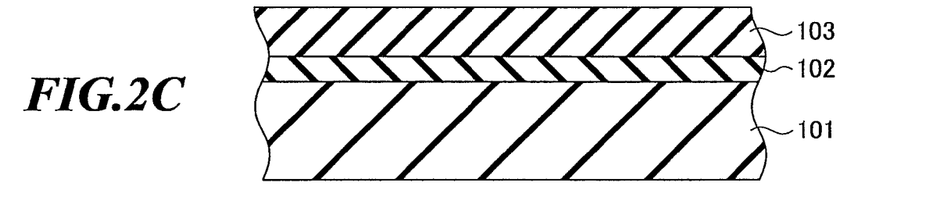
Figure 3:
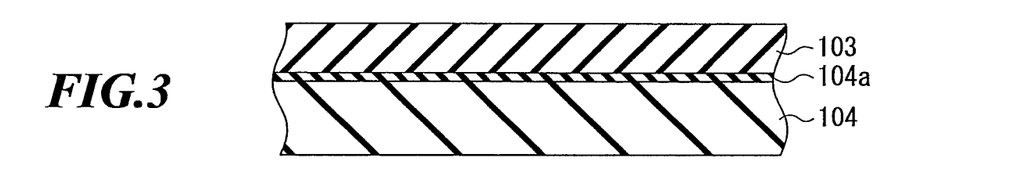
FIG. 3 is a sectional view showing a functional film transferred to a substrate for transfer.

First, at step S1 in FIG. 1, a substrate 101 is prepared as shown in FIG. 2A. The substrate 101 is a substrate for film formation to be used in the manufacturing process of the functional film. As the substrate 101, suitable one is selected from among a single crystal substrate including a semiconductor single crystal substrate and an oxide single crystal substrate, a ceramic substrate and a glass substrate according to a wavelength of an electromagnetic wave to be used and so on. For example, in the case where a wavelength of the electromagnetic wave to be used at the subsequent step is relatively short (e.g., ultraviolet rays), it is desired to use a substrate thorough which the electromagnetic wave is propagated or transmitted. Further, it is also necessary to select a substrate having heat tolerance to the process temperature at the subsequent step, for example, the film formation temperature when the functional film is formed and the heat treatment is performed according to need.

As an oxide single crystal substrate material, specifically, magnesium oxide (MgO), alumina ($Al_2O_3$), titanium oxide ($TiO_2$), zinc oxide (ZnO), spinel (magnesium aluminate, $MgAl_2O_4$), strontium titanate ($SrTiO_3$), lanthanum aluminate ($LaAlO_3$), lithium niobate ($LiNbO_3$), lithium tantalate ($LiTaO_3$) and so on are cited. In the case where the oxide single crystal substrate material is used, by selecting a material having a predetermined lattice constant according to a functional film as a target of manufacturing, the functional film can be formed by epitaxial growth. Further, since these substrates are stable in an oxidizing atmosphere, they can be used for film formation or heat-treated at high temperature (e.g., about 1000° C. for magnesium oxide) in the atmosphere.

As a semiconductor single crystal substrate material, specifically, silicon (Si), germanium (Ge), gallium arsenide (GaAs), gallium phosphide (GaP), indium phosphide (InP) and so on are cited. In the case where the semiconductor single crystal substrate material is used, by selecting a material having a predetermined lattice constant according to a functional film as a target of manufacturing, the functional film can be formed by epitaxial growth. Further, since these substrates are stable in a reducing atmosphere, they can be used for film formation or heat-treated at high temperature (e.g., about 1000° C. for silicon) in the reducing atmosphere.

As a ceramic substrate material, alumina ($Al_2O_3$), zirconia ($ZrO_2$), aluminum nitride (AlN) and so on are cited. Since the ceramic substrate material is more inexpensive than the single crystal substrate, the cost of manufacturing can be reduced. Further, since these substrates are stable in the air atmosphere and have high heat tolerance, they can be used for film formation or heat-treated at high temperature (e.g., about 1100° C. for alumina) in the air atmosphere.

As a glass substrate material, specifically, silicate glass, alkaline silicate glass, borosilicate glass, soda-lime glass, lead glass and so on are cited. Since the glass substrate material is more inexpensive than the single crystal substrate, the cost of manufacturing can be reduced. Further, since these substrates are stable in an oxidizing atmosphere, they can be used for film formation or heat-treated at high temperature (e.g., about 900° C. for silicate glass) in the air atmosphere.

Next, at step S2, a separation layer 102 is formed on the substrate 101 as shown in FIG. 2B. The separation layer 102 is a sacrifice layer that is removed when a functional film to be formed at the subsequent step is peeled from the substrate 101. As a material of the separation layer 102, a material is used that induces a reaction of decomposition or the like by being applied with an electromagnetic wave to generate a gas. Further, in consideration of a process temperature at the subsequent steps such as the film formation temperature when the functional film is formed, it is desired that the material has heat tolerance to about 350° C. or more.

Specifically, a compound containing at least one of carbonates of magnesium carbonate ($MgCO_3$, decomposed at about 600° C.), calcium carbonate ($CaCO_3$, decomposed at about 900° C.), strontium carbonate ($SrCO_3$, decomposed at about 900° C.), barium carbonate ($BaCO_3$, decomposed at about 1450° C.), lithium carbonate ($LiCO_3$, decomposed at about 618° C.), sodium carbonate ($Na_2CO_3$), potassium carbonate ($K_2CO_3$) and so on, a compound containing at least one of sulfates of magnesium sulfate ($MgSO_4$, decomposed at about 1185° C.), calcium sulfate ($CaSO_4$, decomposed at about 1000° C.), strontium sulfate ($SrSO_4$, decomposed at about 1130° C.), barium sulfate ($BaSO_4$, decomposed at about 1200° C.), ferrous sulfate ($FeSO_4$), cobalt sulfate ($CoSO_4$), nickel sulfate ($NiSO_4$), zinc sulfate ($ZnSO_4$), lead sulfate ($PbSO_4$), bismuth sulfate ($Bi(SO_4)_3$) and so on, and a compound containing at least one of nitrates of strontium nitrate ($Sr(NO_3)_2$), cesium nitrate ($CsNO_3$) and so on are used. These compounds are decomposed by being applied with an electromagnetic wave having a predetermined wavelength to generate gases. For example, by heating calcium carbonate, decomposition reaction ($CaCO_3 \rightarrow CaO + CO_2 \uparrow$) occurs and carbon dioxide ($CO_2$) is generated.

Alternatively, metal nitride containing at least one element of Ti, V, Cr, Mn, Fe, Co, Ni, Ga (gallium nitride is decomposed at about 900° C.), Zr, Mo (molybdenum nitride is decomposed at about 900° C.), Ta and W, metal sulfide containing at least one element of V, Cr, Mn, Fe, Co, Ni, Mo, Ta and W, and metal carbide such as TiC may be used. These compounds reacts, when applied with an electromagnetic wave having a predetermined wavelength, with components in the atmosphere and/or an adjacent layer, i.e., components contained in the substrate 101 and/or a layer to be peeled 103, which will be described later, to generate a gas. For example, in the case where a substrate containing oxide and a separation layer containing metal nitride are used, the separation layer reacts with the oxide to generate nitrogen ($N_2$).

As to which of these separation layer materials is selected, it is desired that the selection is made in consideration of interaction (diffusion or the like) with the substrate 101 and a layer to be peeled, which is formed at the next step S3, in addition to conditions of usable electromagnetic waves.

As a method of forming the separation layer, a known method such as spin coating, sputtering and CVD (chemical vapor deposition) methods may be used.

Next, at step S3, a layer to be peeled 103 containing a material of a functional film as a target of manufacturing (functional material) is formed on the separation layer 102, as shown in FIG. 2C. The layer to be peeled 103 is formed by using a known method such as the sputtering method, CVD method, sol-gel method and aerosol deposition (AD) method. Here, the AD method is a film forming method of generating an aerosol in which raw material powder is dispersed in a gas, injecting the aerosol from a nozzle toward a substrate to allow the raw material powder to collide with the under layer, and thereby, depositing the raw material on the substrate, and the method is also called "injection deposition method" or "gas deposition method".

In the embodiment, specifically, the following materials are used as functional materials.

As a material of a functional film to be used for a memory element, $Pb(Zr, Ti)O_3$, $SrBi_2(Ta, Nb)_2O_9$, $Bi_4Ti_3O_{12}$ and so on are cited.

As a material of a functional film to be used for a piezoelectric element such as an actuator, $Pb(Zr, Ti)O_3$, $Pb(Mg_{1/3}Nb_{2/3})O_3$, $Pb(Zn_{1/3}Nb_{2/3})O_3$, $Pb(Ni_{1/3}Nb_{2/3})O_3$ and so on, and solid solutions thereof are cited.

As a material of a functional film to be used for a pyroelectric element such as an infrared sensor, $Pb(Zr, Ti)O_3$, $(Pb, La)(Zr, Ti)O_3$ and so on are cited.

As a material of a functional film to be used for a passive component such as a capacitor, $BaSrTiO_3$, $(Pb, La)(Zr, Ti)O_3$ and so on are cited.

As a material of a functional film to be used for an optical element such as an optical switch, $(Pb, La)(Zr, Ti)O_3$, $LiNbO_3$ and so on are cited.

As a material of a functional film to be used for a superconducting element such as a superconducting quantum interference device (SQUID), $YBa_2Cu_3O_7$, $Bi_2Sr_2Ca_2Cu_3O_{10}$ and so on are cited. Here, SQUID refers to a highly sensitive magnetic sensor element utilizing superconductivity.

As a material of a functional film to be used for a photoelectric conversion element such as a solar cell, amorphous silicon and compound semiconductor are cited.

As a material of a functional film to be used for a micro magnetic element such as a magnetic head, PdPtMn, CoPtCr and so on are cited.

As a material of a functional film to be used for a semiconductor element such as a TFT, amorphous silicon and so on are cited.

The functional film containing structure according to the embodiment includes the substrate 101, the separation layer 102, and the layer to be peeled 103 formed at those steps S1 to S3.

Subsequently, heat treatment (post anneal) may be performed on the functional film containing structure according to need. This is because the function of the film can be improved by promoting the growth of crystal grain contained in the layer to be peeled (functional film) and improving crystallinity. For example, in order to improve the piezoelectric property of a PZT film, heat treatment may be performed at temperature of about 500° C.

Figure 2D:
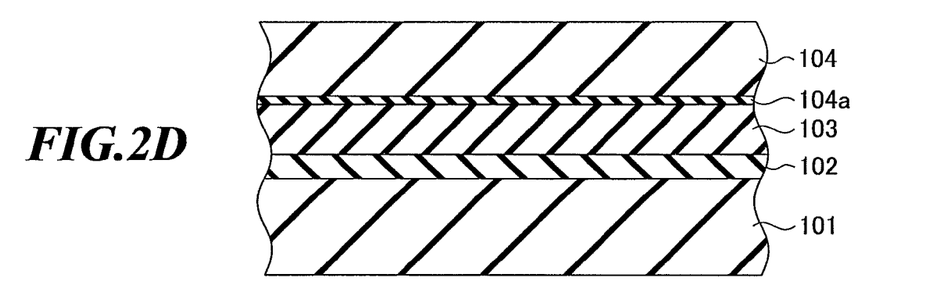

Next, at step S4 in FIG. 1, a substrate for transfer 104 is provided on the layer to be peeled 103 as shown in FIG. 2D. In this regard, the substrate for transfer 104 may be fixed to the layer to be peeled 103 by using an adhesive agent 104a or the like. As the substrate for transfer 104, a desired substrate such as a synthetic resin substrate of epoxy or the like or glass substrate may be used. Further, electrodes and interconnections may be formed at a side of the substrate for transfer 104 in advance.

Figure 2E:
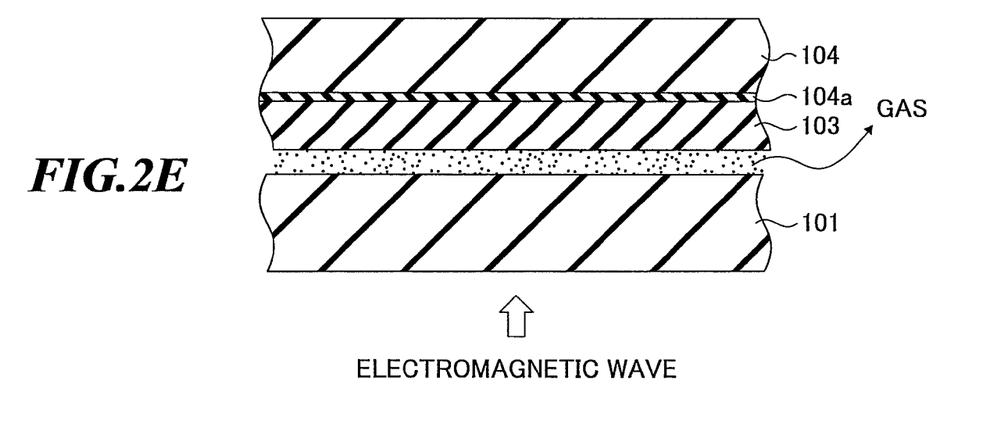

Next, at step S5, an electromagnetic wave is applied to the functional film containing structure 101 to 103. Thereby, as shown in FIG. 2E, reaction such as decomposition occurs in the separation layer 102 and a gas is generated. As a result, the layer to be peeled 103 is peeled from the substrate 101 and the layer to be peeled (functional film) 103 transferred to the substrate for transfer 104 is obtained as shown in FIG. 3. Alternatively, the bonding strength between the layer to be peeled 103 and the substrate 101 becomes lower as a result of generating the gas, and therefore, the layer to be peeled 103 can be dynamically and easily peeled form the substrate 101. In this case, the layer to be peeled 103 can be transferred by peeling the substrate for transfer 104 at the same time as the application of the electromagnetic wave or at the subsequent step.

As the electromagnetic wave, an electromagnetic wave capable of causing the reaction such as deposition in the separation layer 102 can be selected from among an electric wave including a microwave, an infrared ray, a visible ray, an ultraviolet ray and an X-ray. Here, the microwave is an electromagnetic wave having a wavelength of about 1 m to 1 mm, and includes a UHF wave (decimeter wave), a SHF wave (centimeter wave), an EHF wave (millimeter wave) and a submillimeter wave.

For example, in the case where an infrared ray containing a component having an absorption wavelength of the separation layer material is applied to the separation layer 102, molecules contained in the separation layer material absorb the infrared energy to greatly vibrate, and consequently, reaction such as decomposition occurs in the separation layer. Specifically, the case where an infrared ray having a wavelength of about 6.8 μm or 11.6 μm is applied to calcium carbonate ($CaCO_3$) is cited. Further, in the case where an ultraviolet ray containing a component having an absorption wavelength of the separation layer material is applied to the separation layer 102, atoms contained in the separation layer material absorb the ultraviolet energy so that outer electrons make transition and become activated, and consequently, reaction such as decomposition occurs in the separation layer. Specifically, the case where an ultraviolet ray having a wavelength of about 248 nm is applied to calcium carbonate is cited. In this case, the separation layer is decomposed due to photodecomposition, and therefore, no extra heat is generated. Therefore, there is an advantage that the substrate 101 and the layer to be peeled 103 are not affected by heat. In the case where the electromagnetic wave having a relatively low wavelength such as an ultraviolet ray is applied, in order to propagate the electromagnetic wave to the separation layer 102, it is desired to apply the electromagnetic wave from a side of the substrate 101 as shown in FIG. 2E. Alternatively, the electromagnetic wave may be applied toward the side surface of the functional film containing structure.

By the way, in the case where a microwave is applied to the separation layer 102, the separation layer 102 generates heat and reaction occurs according to the principle of microwave heating. Here, absorption energy P of the microwave is expressed by the following equation (1).

$$P = (1/2)\sigma |E|^2 + \pi f \epsilon_0 \epsilon_r'' |E|^2 + \pi f \mu_0 \mu_r'' |H|^2 \quad (1)$$

In equation (1), σ represents an electric conductivity, f (Hz) represents a frequency of the microwave, $\epsilon_0$ represents a dielectric constant of vacuum, $\epsilon_r''$ represents a relative dielectric constant (complex), $\mu_0$ represents a permeability of vacuum, $\mu_r''$ represents a relative permeability (complex), E represents an electric field intensity, and H represents a magnetic field intensity. Further, the first term of the equation (1) represents joule loss (resistance loss), the second term represents dielectric loss, and the third item represents magnetic hysteresis loss.

When an electromagnetic field is applied by applying a microwave to the separation layer 102, heat corresponding to energy expressed by the equation (1) is generated. As a result, reaction such as decomposition occurs in the separation layer 102. Therefore, in the case of using a microwave, in order to efficiently generate heat, it is desired that a material having a large relative dielectric constant (complex) $\epsilon_r''$, a material having a large relative permeability (complex) $\mu_r''$, or a material having a large electric conductivity σ is used as the separation layer 102. In the case of using a microwave, the microwave can reach the interior of the functional film containing structure without especially limiting an orientation of the microwave to be applied to the functional film containing structure.

EXAMPLE 1

A calcium carbonate thin film having a thickness of about 0.1 μm is formed as a separation layer by applying a calcium hydrogen carbonate solution onto a quartz substrate by spin coating and drying it in an atmosphere at 200° C. A lower electrode of platinum (Pt) is formed by evaporation on the calcium carbonate thin film, and a BST (barium strontium titanate) film having a thickness of about 200 nm is formed thereon by using the sputtering method. At this time, the substrate is heated to a temperature of 550° C. Furthermore, an upper electrode of platinum is on the BST film formed by using the sputtering method, and thereby, a Pt/BST/Pt thin film capacitor is fabricated.

Then, an adhesive agent is applied onto the upper electrode of the Pt/BST/Pt thin film capacitor formed on the quartz substrate, and an epoxy substrate is bonded as a substrate for transfer. Furthermore, a KrF excimer laser beam having a wavelength of 248 nm is applied toward the calcium carbonate thin film from the quartz substrate side. Thereby, the calcium carbonate thin film is decomposed, and consequently, the Pt/BST/Pt thin film capacitor is peeled from the quartz substrate and transferred to the epoxy substrate.

EXAMPLE 2

A titanium nitride film having a thickness of about 0.3 μm is formed as a separation layer on a magnesium oxide (MgO) substrate by using the reactive sputtering method. Then, a lower electrode of platinum (Pt) is formed on the titanium nitride film by using the sputtering method. A BST (barium strontium titanate) film having a thickness of about 200 nm is formed on the lower electrode by using the sputtering method. At this time, the substrate is heated to a temperature of about 550° C. Furthermore, an upper electrode of platinum is formed on the BST film by using the sputtering method. Thereby, a Pt/BST/Pt thin film capacitor is fabricated.

Then, an adhesive agent is applied onto the upper electrode of the Pt/BST/Pt thin film capacitor formed on the magnesium oxide substrate, and an epoxy substrate is bonded as a substrate for transfer. Furthermore, a YAG laser beam having a wavelength of 1.06 μm is applied from the magnesium oxide substrate side toward the titanium nitride film. Thereby, the titanium nitride film reacts with the laser beam to generate a gas, and consequently, the Pt/BST/Pt thin film capacitor is peeled from the magnesium oxide substrate and transferred to the epoxy substrate.

As explained above, according to the first embodiment of the present invention, by applying an electromagnetic wave to the separation layer, the functional film can be easily peeled from the film formation substrate, or the bonding strength between them can be reduced to make it easy to peel the functional film from the film formation substrate. In this regard, a reaction can be selectively caused only in the separation layer at lower temperature (about 10° C. to about 100° C.) than thermal reaction by suitably combining a wavelength of the electromagnetic wave and the separation layer material. Therefore, a functional film formed by a film formation technology such as the sputtering method and AD method through predetermined process temperature (e.g., about 350° C. or more) and an element containing such a functional film can be transferred to a desired substrate and utilized. That is, since the transfer can be performed to a resin substrate having relatively low heat tolerance, the range of choices of substrates can be expanded to a flexible substrate, for example, according to application.

Figure 4:
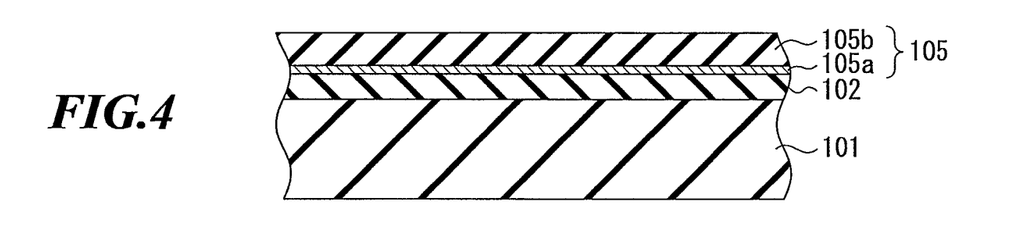
FIG. 4 is a sectional view showing a modified example of a functional film containing structure.
Figure 5:
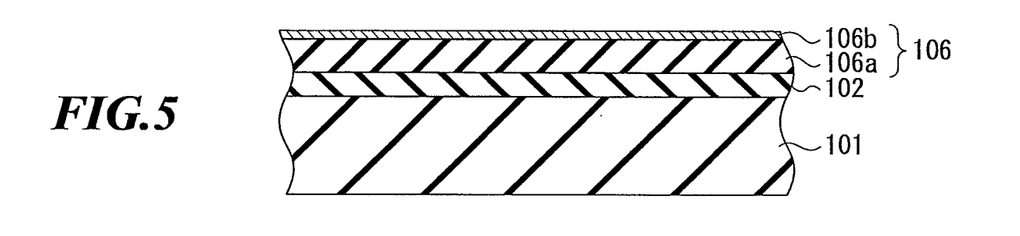
FIG. 5 is a sectional view showing another modified example of the functional film containing structure.

As a modified example of the functional film containing structure to be used in the manufacturing process of the functional film according to the embodiment, as shown in FIG. 4, a layer to be peeled 105 including an electrode layer 105a and a functional material layer 105b may be formed. Further, as another modified example of the functional film containing structure, as shown in FIG. 5, a layer to be peeled 106 including a functional material layer 106a and an electrode layer 106b may be formed. Furthermore, a layer to be peeled including electrode layers on both of upper and lower surfaces of the functional material layer may be used. The electrode layers 105a and 106b may be formed by using a known method such as the sputtering method and evaporation method.

Further, in the embodiment, at step S5, the layer to be peeled 103 has been transferred to the substrate for transfer 104 at the same time as being peeled from the substrate 101. However, only the peeling of the layer to be peeled 103 may be performed without providing the substrate for transfer 104 to the layer to be peeled 103. Thereby, a functional film, or a functional element containing a functional film and an electrode can be obtained singly.

Next, a method of manufacturing a functional film according to the second embodiment will be explained by referring to FIGS. 2A to 2C and FIGS. 6A to 6D. The method of manufacturing a functional film according to this embodiment is a method of manufacturing a patterned functional film.

First, as shown in FIGS. 2A to 2C, a functional film containing structure 101 to 103 in which a separation layer 102 and a layer to be peeled 103 are formed on a substrate 101 is fabricated. The method of manufacturing the film containing structure 101 to 103 is the same as that has been explained in the first embodiment.

Figure 6A:
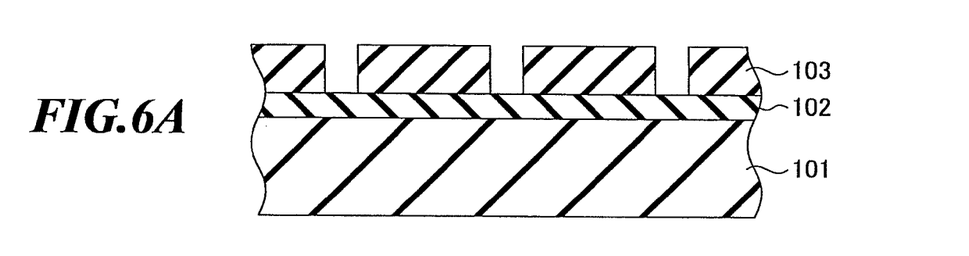
FIGS. 6A to 6D are diagrams for explanation of the method of manufacturing a functional film according to the second embodiment of the present invention.

Then, as shown in FIG. 6A, a pattern is formed on the layer to be peeled 103 by dry etching. In this regard, etching may be performed only on the layer to be peeled 103 as shown in FIG. 6A, or etching may be performed to the separation layer 102.

Figure 6B:
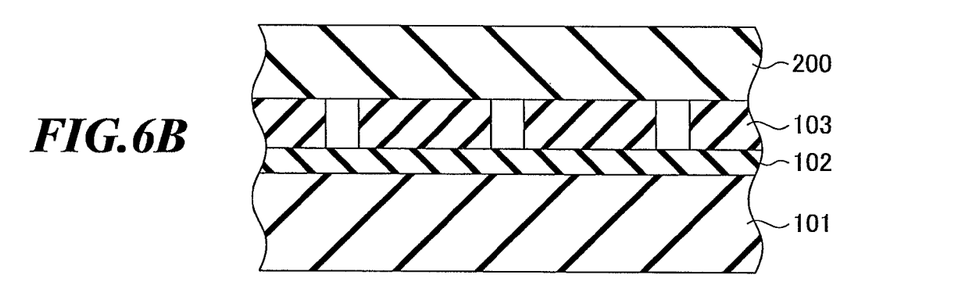

Further, as shown in FIG. 6B, a substrate for transfer 200 is provided on the layer to be peeled 103 on which the pattern has been formed. In this regard, the substrate for transfer 200 may be fixed to the layer to be peeled 103 by using an adhesive agent or the like. Further, as the substrate for transfer 200, a synthetic resin substrate, glass substrate or the like can be used similarly to the first embodiment.

Figure 6C:
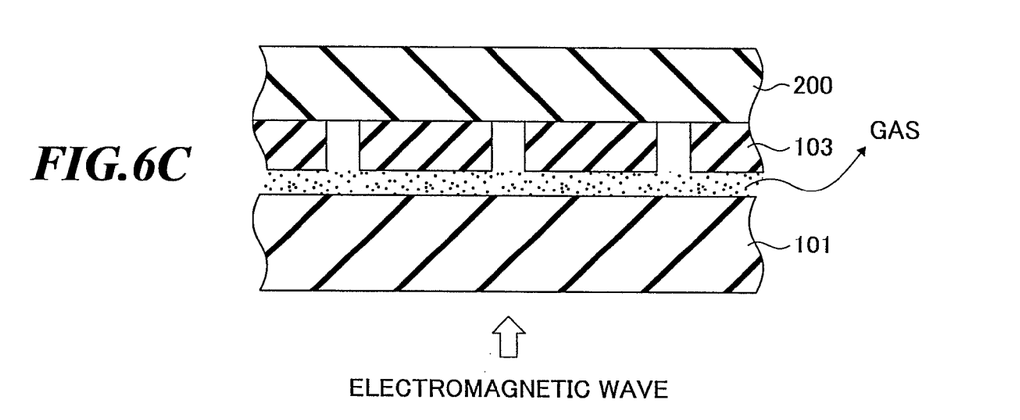
Figure 6D:
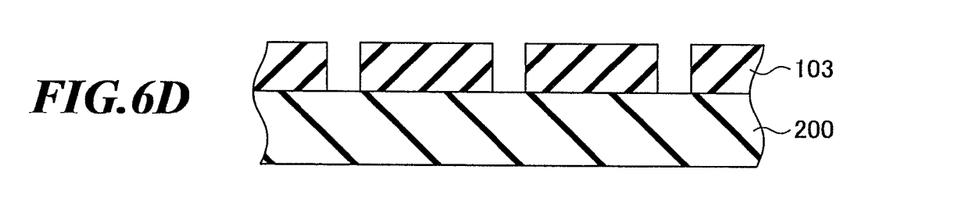

Furthermore, as shown in FIG. 6C, an electromagnetic wave is applied to the functional film containing structure 101 to 103. Thereby, reaction such as decomposition occurs in the separation layer 102 and a gas is generated. As a result, as shown in FIG. 6D, the patterned layer to be peeled (functional film) 103 is transferred to the substrate for transfer 200. Alternatively, the bonding strength between the layer to be peeled 103 and the substrate 101 becomes lower because of generating the gas, and the layer to be peeled 103 is transferred by peeling the substrate for transfer 200 at the same time as the application of the electromagnetic wave or at the subsequent step.

Thus, according to the second embodiment of the present invention, the pattern has been formed on the layer to be peeled of the functional film containing structure in advance, and thereby, the functional film or functional film element can be provided on the desired substrate to form a desired pattern. Therefore, an array, in which plural functional elements are arranged, can be fabricated easily.

In the above explained first and second embodiments of the present invention, the functional film containing structure may be heated in parallel to application of the electromagnetic wave to the separation layer 102. Thereby, the reaction in the separation layer 102 is promoted by heat, and the effect of improving the function of the functional film is expected. In this case, it is necessary to determine the heat treatment temperature in consideration of heat tolerance of the substrate for transfer 104 and the adhesive agent 104a (FIG. 2D).

INDUSTRIAL APPLICABILITY

The present invention can be applied to memory elements, piezoelectric elements, pyroelectric elements, passive elements such as capacitors, optical elements, superconducting elements, photoelectric conversion elements, micro magnetic elements and semiconductor elements containing functional materials such as dielectric materials, piezoelectric materials, pyroelectric materials, magnetic material and semiconductor materials, and instruments to which those elements are applied.

The invention claimed is:

1. A functional film containing structure comprising:
   a substrate;
   a separation layer provided on said substrate and containing an inorganic material which is decomposed to generate a gas by being applied with an electromagnetic wave; and
   a layer to be peeled provided on said separation layer and containing one of a functional film consisting of at least one metal material and a functional film consisting of an oxide of at least one metal material;
   wherein said layer to be peeled is peeled from said substrate or bonding strength between said layer to be peeled and said substrate becomes lower by applying the electromagnetic wave toward said separation layer.

2. The functional film containing structure according to claim 1, wherein said separation layer contains at least one of carbonate, sulfate and nitrate.

3. The functional film containing structure according to claim 2, wherein said separation layer contains at least one of magnesium carbonate ($MgCO_3$), calcium carbonate ($CaCO_3$), strontium carbonate ($SrCO_3$), barium carbonate ($BaCO_3$), lithium carbonate ($LiCO_3$), sodium carbonate ($Na_2CO_3$), potassium carbonate ($K_2CO_3$), magnesium sulfate ($MgSO_4$), calcium sulfate ($CaSO_4$), strontium sulfate ($SrSO_4$), barium sulfate ($BaSO_4$), iron sulfate ($FeSO_4$), cobalt sulfate ($CoSO_4$), nickel sulfate ($NiSO_4$), zinc sulfate ($ZnSO_4$), lead sulfate ($PbSO_4$), bismuth sulfate ($Bi(SO_4)_3$), strontium nitrate ($Sr(NO_3)_2$) and cesium nitrate ($CsNO_3$).

4. A method of manufacturing a functional film, said method comprising the steps of:
   (a) forming a separation layer on a substrate by using an inorganic material which is decomposed to generate a gas by being applied with an electromagnetic wave;
   (b) forming a layer to be peeled on said separation layer after step (a), said layer to be peeled containing one of a functional film consisting of at least one metal material and a functional film consisting of an oxide of at least one metal material; and
   (c) applying the electromagnetic wave toward said separation layer after step (b) so as to peel said layer to be peeled from said substrate or reduce bonding strength between said layer to be peeled and said substrate.

5. The method of manufacturing a functional film according to claim 4, wherein said separation layer contains at least one of carbonate, sulfate and nitrate.

6. The method of manufacturing a functional film according to claim 5, wherein said separation layer contains at least one of magnesium carbonate ($MgCO_3$), calcium carbonate ($CaCO_3$), strontium carbonate ($SrCO_3$), barium carbonate ($BaCO_3$), lithium carbonate ($LiCO_3$), sodium carbonate ($Na_2CO_3$), potassium carbonate ($K_2CO_3$), magnesium sulfate ($MgSO_4$), calcium sulfate ($CaSO_4$), strontium sulfate ($SrSO_4$), barium sulfate ($BaSO_4$), iron sulfate ($FeSO_4$), cobalt sulfate ($CoSO_4$), nickel sulfate ($NiSO_4$), zinc sulfate ($ZnSO_4$), lead sulfate ($PbSO_4$), bismuth sulfate ($Bi(SO_4)_3$), strontium nitrate ($Sr(NO_3)_2$) and cesium nitrate ($CsNO_3$).

7. The method of manufacturing a functional film according to claim 4, wherein said substrate includes one of a single crystal substrate, which includes one of an oxide single crystal substrate and a semiconductor single crystal substrate, and a ceramic substrate and a glass substrate.

8. The method of manufacturing a functional film according to claim 4, wherein said functional film contains at least one of a piezoelectric material, a pyroelectric material, a ferroelectric material, a superconducting material, a magnetic material, and a semiconductor material.

9. The method of manufacturing a functional film according to claim 4, wherein step (b) includes forming an electrode layer on said separation layer, and forming the functional film on said electrode layer.

10. The method of manufacturing a functional film according to claim 4, wherein step (b) includes forming an electrode layer on the functional film formed directly or indirectly on said separation layer.

11. The method of manufacturing a functional film according to claim 4, wherein step (c) includes applying an ultraviolet ray toward said separation layer.

12. The method of manufacturing a functional film according to claim 4, wherein step (c) includes applying an infrared ray toward said separation layer.

13. The method of manufacturing a functional film according to claim 4, wherein step (c) includes applying microwave toward said separation layer.

14. The method of manufacturing a functional film according to claim 4, further comprising the step of:
   (b') providing a second substrate on said layer to be peeled prior to step (c);
   wherein step (c) includes applying the electromagnetic wave toward said separation layer to transfer said layer to be peeled to said second substrate.

15. The method of manufacturing a functional film according to claim 14, wherein step (b') includes fixing said second substrate to said layer to be peeled by using an adhesive agent.

16. The method of manufacturing a functional film according to claim 14, further comprising the step of:
   forming a pattern in at least said layer to be peeled by etching prior to step (b');
   wherein step (c) includes applying the electromagnetic wave toward said separation layer to transfer said layer to be peeled formed with the pattern to said second substrate.

* * * * *